United States Patent [19]

Mignardi

[11] Patent Number: 5,389,182

[45] Date of Patent: Feb. 14, 1995

[54] USE OF A SAW FRAME WITH TAPE AS A SUBSTRATE CARRIER FOR WAFER LEVEL BACKEND PROCESSING

[75] Inventor: Michael A. Mignardi, Dallas, Tex.

[73] Assignee: Texas Instruments Incorporated, Dallas, Tex.

[21] Appl. No.: 101,122

[22] Filed: Aug. 2, 1993

[51] Int. Cl.6 .............................................. B32B 35/00
[52] U.S. Cl. .................................... 156/344; 437/226; 29/412; 29/415
[58] Field of Search ................ 156/344, 584; 437/226; 29/412, 413, 415, 426.1, 426.5, 426.6

[56] References Cited

U.S. PATENT DOCUMENTS

| | | | |
|---|---|---|---|
| 3,562,057 | 2/1971 | McAlister et al. | 29/413 X |
| 4,203,127 | 5/1980 | Tegge, Jr. | 29/413 X |
| 4,296,542 | 10/1981 | Gotman | 437/226 X |
| 4,597,003 | 6/1986 | Aine et al. | 437/228 X |
| 4,711,014 | 12/1987 | Althouse | 156/344 X |
| 4,904,610 | 2/1990 | Shyr | 437/227 X |
| 5,151,389 | 9/1992 | Zappella | 437/226 |
| 5,226,099 | 7/1993 | Mignardi et al. | 385/19 |

FOREIGN PATENT DOCUMENTS

| | | | |
|---|---|---|---|
| 0126473 | 10/1979 | Japan | 29/413 |
| 55-86173 | 6/1980 | Japan | 437/226 |
| 62-293639 | 12/1987 | Japan | 437/226 |

*Primary Examiner*—David A. Simmons
*Assistant Examiner*—Mark A. Osele
*Attorney, Agent, or Firm*—Charles A. Brill; James C. Kesterson; Richard L. Donaldson

[57] ABSTRACT

A method for processing a wafer containing microelectronic mechanical devices that allows all fabrication and test steps to be performed in wafer form instead of device form. The wafer 20 is mounted in a saw frame 24 on dicing tape 22 and the individual devices 27 separated, typically by sawing, prior to completing device fabrication. The devices are left on the dicing tape during the remaining fabrication steps. Some fabrication steps may require covering the adhesive of the dicing tape with a protective cover 44. After all fabrication steps including the application of a protective overcoat and functional testing are completed, the devices are removed from the dicing tape and packaged.

19 Claims, 8 Drawing Sheets

USE OF A SAW FRAME WITH TAPE AS A SUBSTRATE CARRIER FOR WAFER LEVEL BACKEND PROCESSING

FIELD OF THE INVENTION

This invention relates to the field of integrated circuit processing, more particularly to microelectronic mechanical device fabrication, including deformable micromirror devices.

BACKGROUND OF THE INVENTION

In order for integrated circuit (IC) processing to be cost effective, the individual circuits, or devices, are typically mass produced using a semiconductor wafer to make many devices on a single substrate simultaneously. A typical process flow for integrated circuits follows the steps of device fabrication, device testing, device separation, and device packaging. When the devices are separated from a wafer, dicing debris, comprised of wafer particles and dust, is created. This dicing debris is washed from the surface of the IC prior to bonding the device to the package.

Microelectronic mechanical systems (MEMS), or micromechanical devices, often have structures that are too fragile to survive exposure to some of the standard IC fabrication steps such as device separation and cleanup. The fragile nature of some MEMS, for example the digital micromirror device (DMD) and some accelerometers, requires that the standard IC process steps be reordered to avoid damaging the completed devices. DMDs are explained in U.S. Pat. No. 5,061,049, "Spatial Light Modulator and Method", which is assigned to Texas Instruments Incorporated. Accelerometers are described in U.S. Pat. Ser. No. 08/142,548, "Digital Accelerometer", which is also assigned to Texas Instruments Incorporated. As described in the aforementioned patents, these MEMS have very small structures suspended over an air gap above electrodes formed on the surface of a silicon substrate. Once these structures are formed and the sacrificial material is etched from the air gap, the devices are very fragile. The devices cannot be exposed to liquids, such as would occur during water cleanup steps, without risking destruction of the mirror. Therefore, the devices must be cut and the dicing debris washed away before etching the sacrificial material from underneath the mirror.

Wafer separation prior to device completion results in extensive device handling during the remaining device fabrication steps such as passivation and device testing. Performing these processes in wafer form as opposed to device form greatly reduces the necessary handling because the processing equipment must only move and align to one wafer instead of many devices. Precise alignment is very critical for die testing.

This invention discloses a method wherein the entire device fabrication and testing process can be completed using wafer processing techniques.

SUMMARY OF THE INVENTION

A method of fabricating microelectronic mechanical or integrated circuit devices wherein a wafer of partially completed devices is mounted on dicing tape in a saw frame. The devices are then separated either by sawing the wafer or by other wafer separation techniques. Fabrication of the devices is completed before removing the devices from the dicing tape. In some applications it may be advantageous to cover the exposed adhesive of the dicing tape with a protective cover. The advantage of this method is that the devices can be completely processed using efficient industry standard wafer handling techniques.

DETAILED DESCRIPTION OF THE PREFERRED EMBODIMENTS

The disclosed method and protective cover are applicable to the production of any device that is produced in water form, especially microelectronic mechanical devices having fragile structures which prevent the use of conventional wafer fabrication process flows. For illustration purposes, the invention will be taught using examples from the production of digital micromirror devices and accelerometers. Specific examples are intended only to illustrate one possible implementation of the invention and are not intended to limit the invention to the production of DMDs or accelerometers. The disclosed method could be used for fabricating any type of integrated circuit or microelectronic mechanical device.

Figure 1:
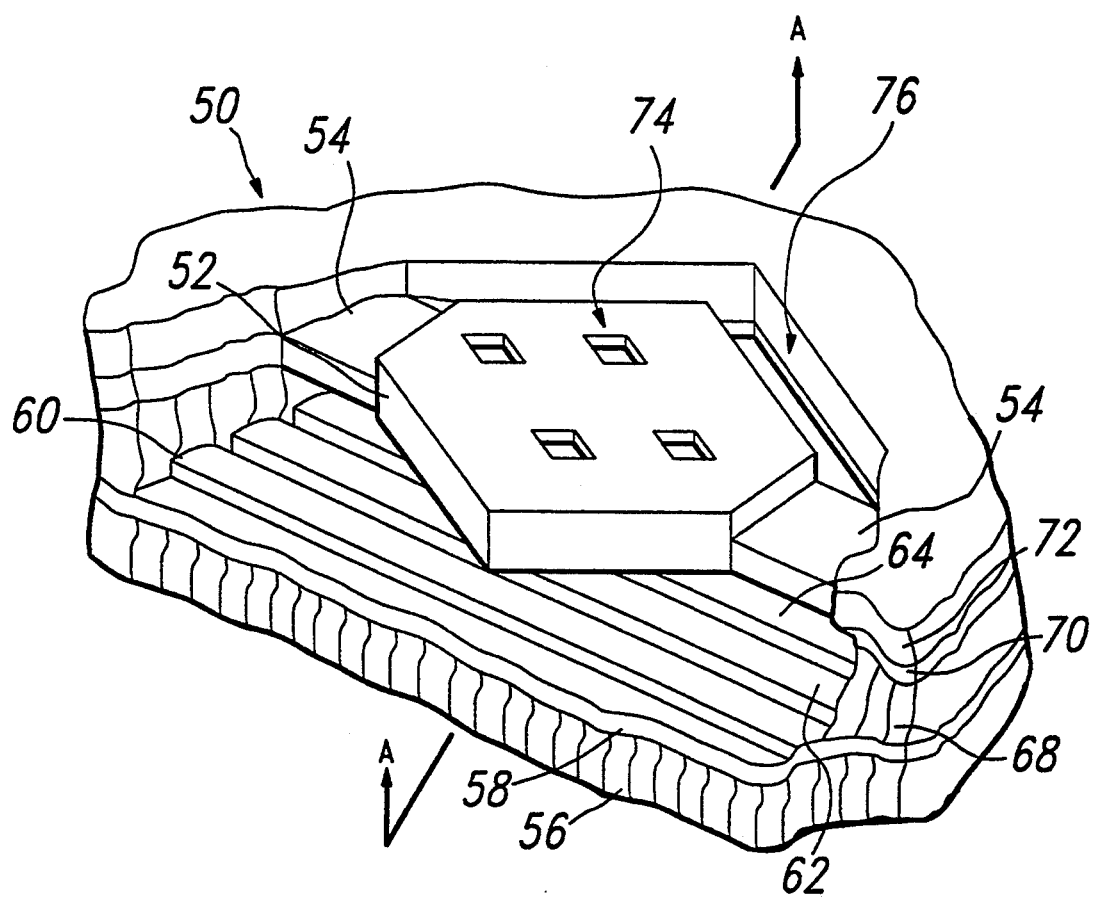
FIG. 1 is perspective view of one element of a digital micromirror device.
Figure 1A:
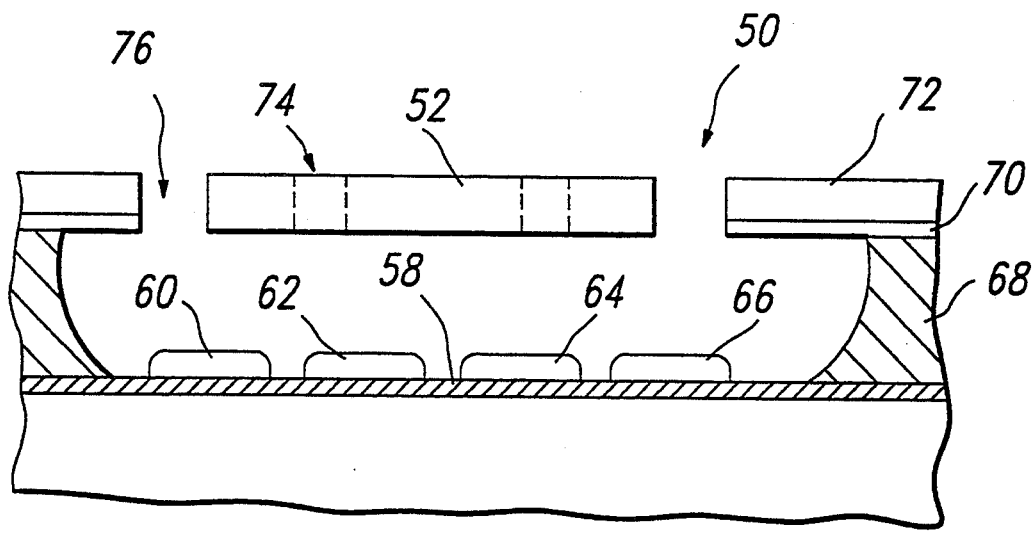
FIG. 1A is a sectional view of the device of FIG. 1 taken along line A—A of FIG. 1 showing the elements comprising the device.
Figure 1B:
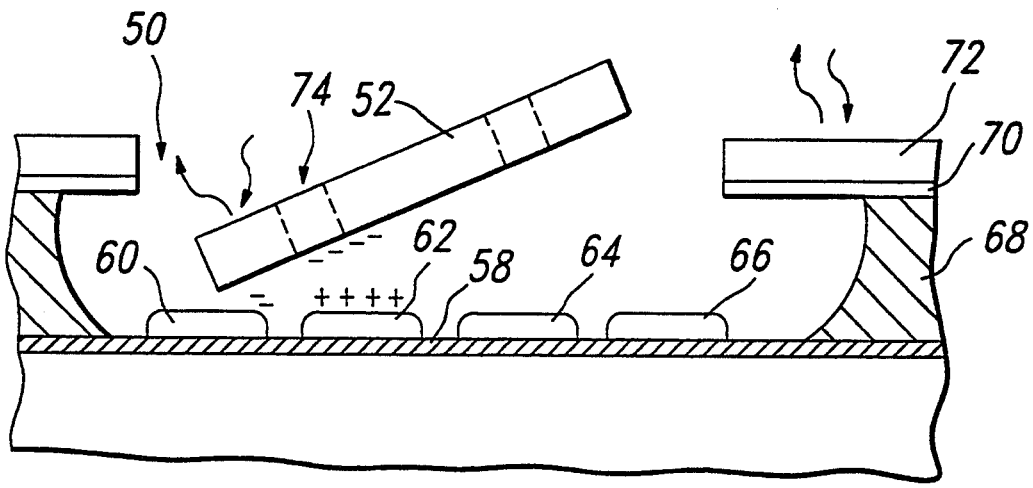
FIG. 1B is a sectional view of the device of FIG. 1 taken along line A—A of FIG. 1 showing the rotation of the mirror beam.

A typical DMD device structure is shown in FIGS. 1 through 1B. As with all of the Figures included in this disclosure, the elements shown are not to scale. In most cases the thickness of the wafers and device layers have been greatly exaggerated for illustrative purposes. DMDs are typically comprised of an array of elements 50. Each DMD element 50 is typically comprised of a metal beam 52, suspended by two torsion hinges 54, over a silicon substrate 56. An insulating oxide layer 58 is grown on the silicon substrate 56 and address and landing electrodes 60, 62, 64 and 66 are deposited on the oxide layer 58. A planarizing spacer layer 68, sometimes called a sacrificial layer, is applied to the substrate and a layer of hinge metal 70, followed by a layer of beam metal 72 is deposited on the spacer layer 68. The metal layers are etched to define the hinges 54 and beam 52 of each element 50.

The typical process flow for DMD fabrication requires separating the devices, usually by sawing between the rows of devices on a wafer, better undercutting the mirrors. After the devices are separated, the spacer layer 68 is etched away below the beam 52 and hinges 54 to allow the beam to twist on the hinges, as shown in FIG. 1B. The undercut operation is usually done in a plasma reactor. Access holes 74 and gap 76 allow the plasma to etch away the spacer material 68 below the beam 52 and hinges 54. After the spacer layer 68 has been etched away the device is made less chemically reactive by a process called passivation.

Figure 2:
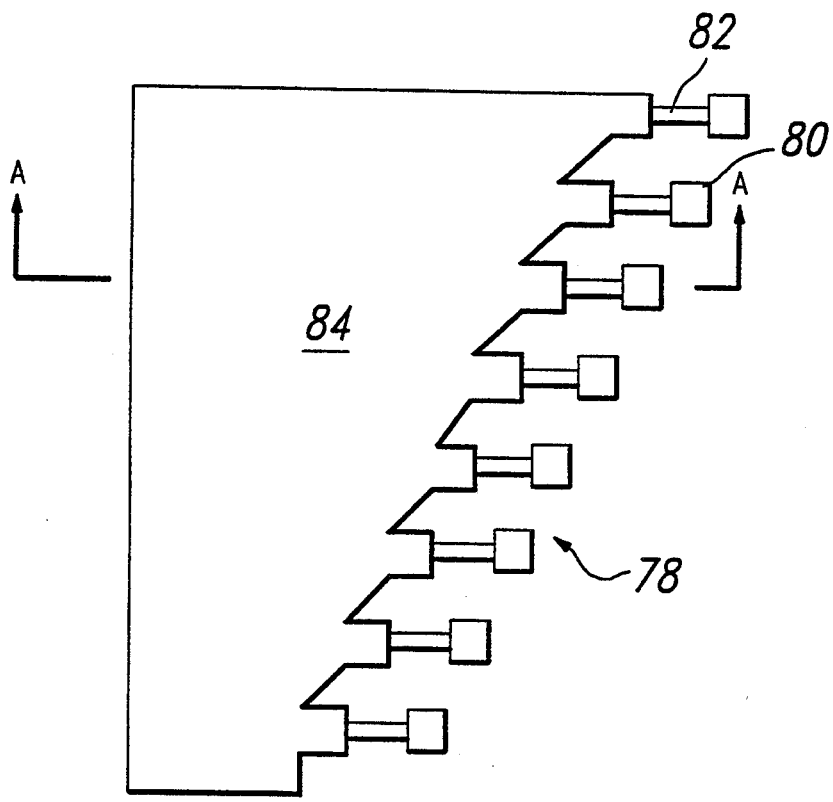
FIG. 2 is a top view of an array of digital accelerometers.
Figure 2A:
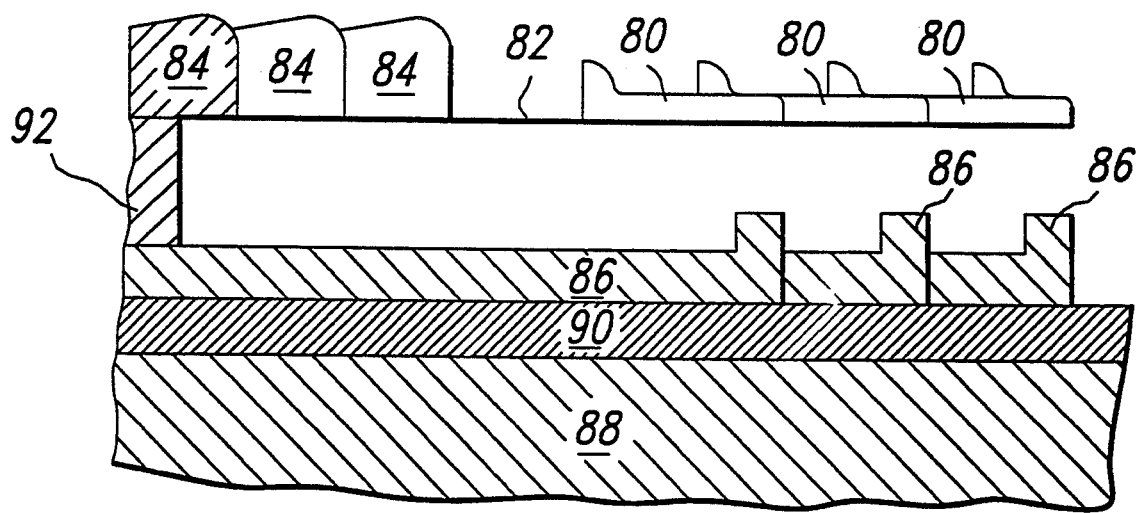
FIG. 2A is a sectional view of the device of FIG. 2 taken along line A—A of FIG. 2 showing the elements comprising the device.

A similar process flow is used to fabricate some accelerometers. FIG. 2 shows an array of cantilever beam accelerometers 78. Each accelerometer is comprised of a precision mass, called a proof mass 80, supported by a hinge 82 attached to a beam 84. Below each accelerometer is a contact 86 which has been deposited on a silicon substrate 88 covered by an insulating oxide layer 90. A planarizing spacer layer 92 separates the beams 84 from the electrodes 86. After etching the spacer layer away below the proof masses 80 and hinges 82, a strong enough acceleration force can cause the proof mass 80 to deflect and touch contact 86.

As discussed above, once the spacer layer 68 or 92 is etched away, the devices are very fragile and cannot be exposed to liquids, tier example during wafer cleanup steps, without destroying the device. Because the completed devices cannot be washed, the devices are typically sawn apart better etching away the spacer layer. After being sawn apart, they are handled individually during the undercut, die testing, and protective overcoat steps.

Figure 3:
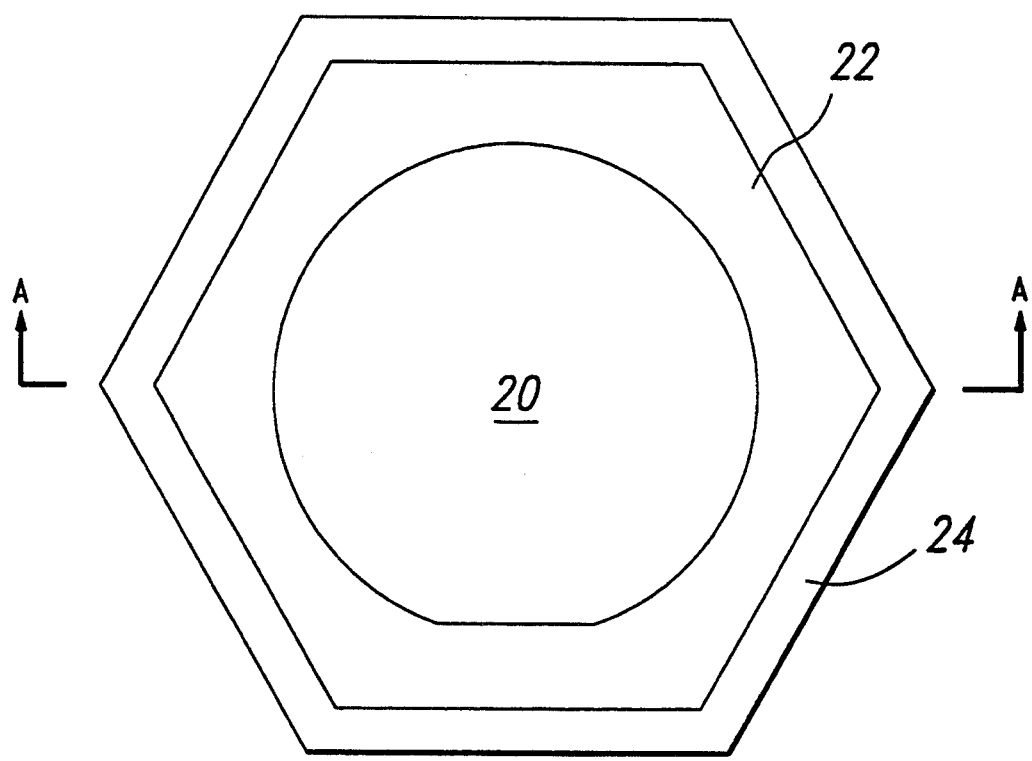
FIG. 3 is a top view of a silicon water mounted on dicing tape held in a saw frame.
Figure 3A:
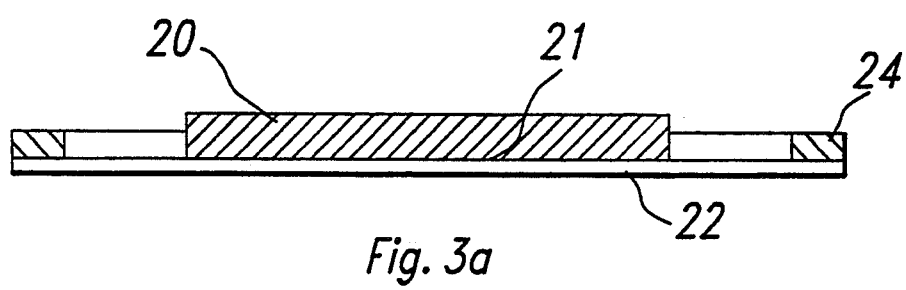
FIG. 3A is a sectional view of the silicon water of FIG. 3 taken along line A—A of FIG. 3.

The present invention allows all of the devices frown one wafer to be handled collectively throughout the fabrication process. According to one embodiment of the disclosed invention, shown in FIG. 3, a silicon wafer 20 containing partially completed microelectronic mechanical devices is mounted on the adhesive side 21 of the dicing tape 22 which is held in a saw frame 24. FIG. 3A is a sectional view of the water 20 on the dicing tape 22 in the saw frame 24.

The wafer 20 is typically silicon but could be made of other materials, for example quartz or gallium-arsenide. A temporary protective coating may be applied to the surface of the wafer 20 prior to mounting the wafer in the saw frame to prevent damaging the wafer during the saw operation. The saw frame is mounted as necessary to allow the devices to be sawn apart. The saw typically cuts completely through the wafer and into the dicing tape. However, the dicing tape is not cut through. For example, the dicing tape thickness may be 4 mils of which only 1 mil is cut.

Figure 4:
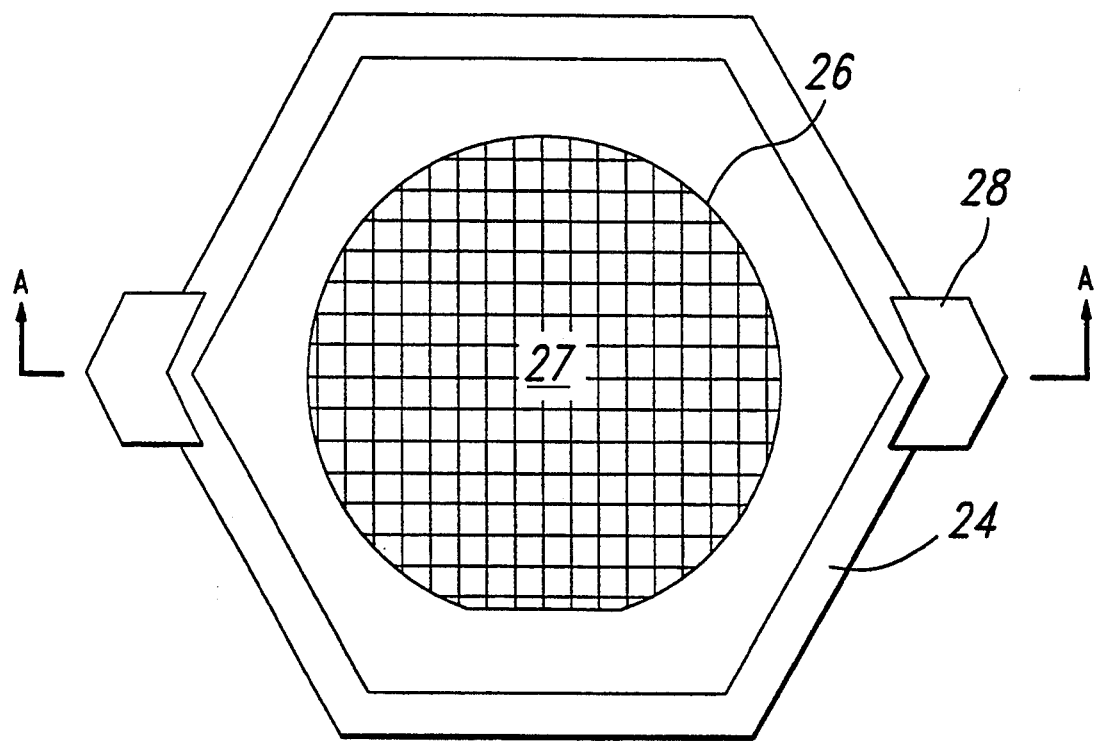
FIG. 4 is a top view of a sawn water mounted in a saw frame held in a centrifuge.
Figure 4A:
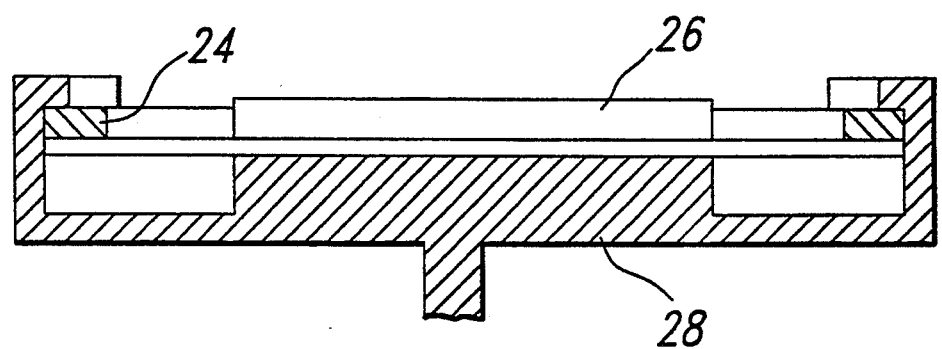
FIG. 4A is a sectional view of the wafer of FIG. 4 taken along line A—A of FIG. 4.

After the water is sawn apart, the particles created during the saw operation are cleaned off of the wafer, dicing tape, and saw frame, typically by washing. If a temporary protective coating has been applied to the wafer, the saw frame can be mounted in a centrifuge and a solvent sprayed on the wafer to remove the protective coating. FIGS. 4 and 4A show the sawn water 26 and saw frame 24 mounted in a centrifuge 28. The size and orientation of the devices 27 shown in FIG. 4 is for illustrative purposes only. For clarity, the individual devices are not shown in FIG. 4A. While mounted in the centrifuge, a solvent is sprayed on the surface of the wafer to remove the protective coating. The centrifuge causes the solvent and dissolved coating to be spun off of the water.

Figure 5:
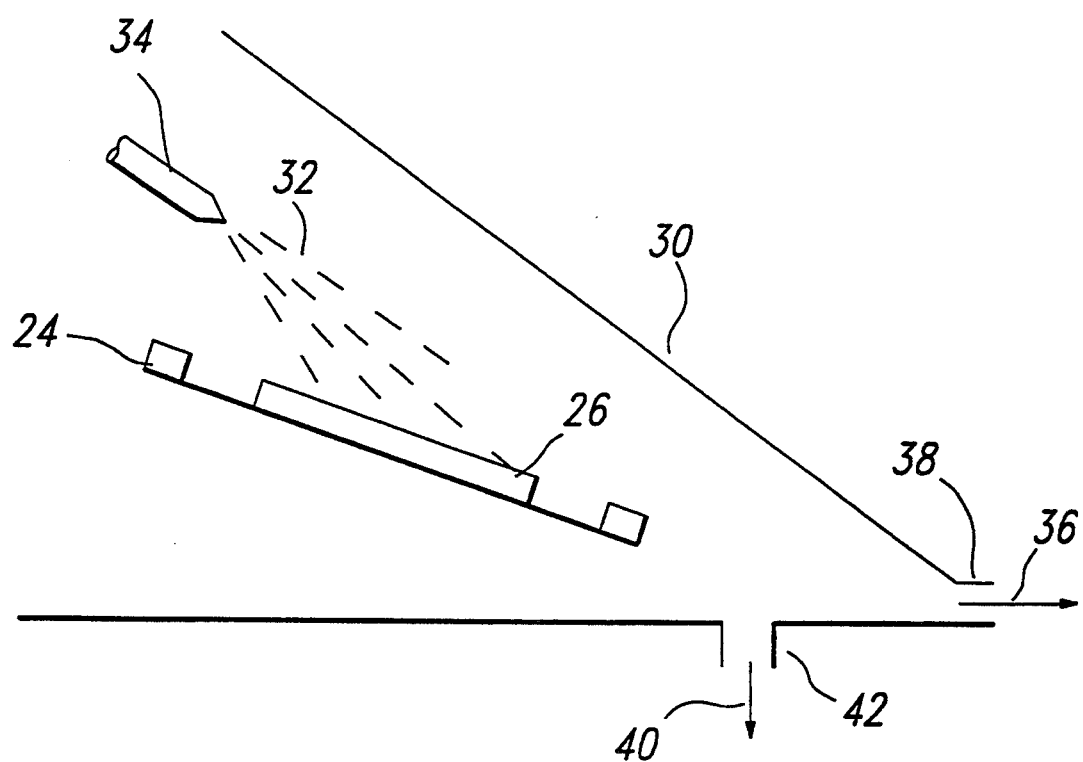
FIG. 5 is a schematic side view of a wafer and saw frame held in a spray develop hood.

An alternative to removing the temporary protective coating in a centrifuge is to mount the saw frame in a spray develop hood. FIG. 5 shows the water 26 and saw frame 24 mounted in a spray develop hood 30. While in the spray develop hood, solvent 32 is sprayed out of a spray nozzle 34 onto the surface of the sawn wafer 26. Solvent gases 36 are removed through a vent 38 at the back of the hood. The solvent and particles 40 exit the hood through a drain 42 at the bottom of the hood.

Figure 6:
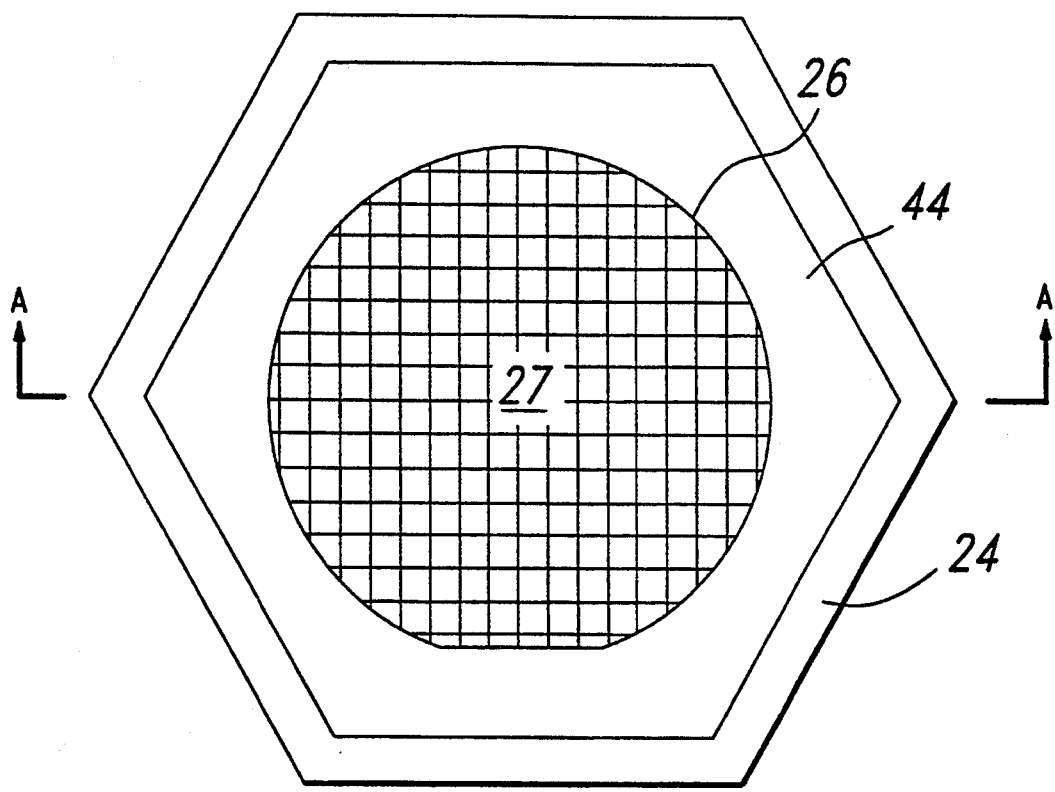
FIG. 6 is a top view of a sawn wafer mounted in a saw frame with a protective cover over the exposed dicing tape.
Figure 6A:
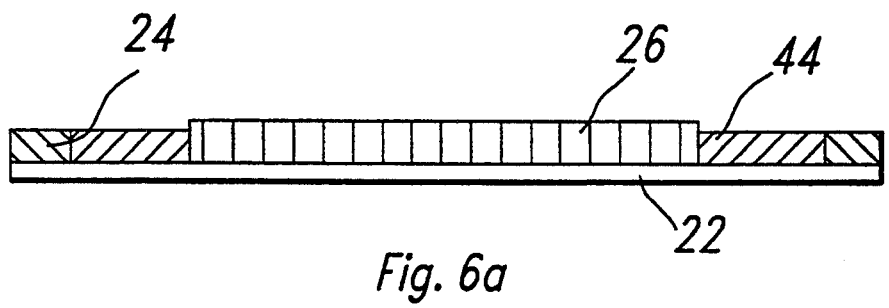
FIG. 6A is a sectional view of the sawn wafer and protective cover of FIG. 6 taken along line A—A of FIG. 6.
Figure 7:
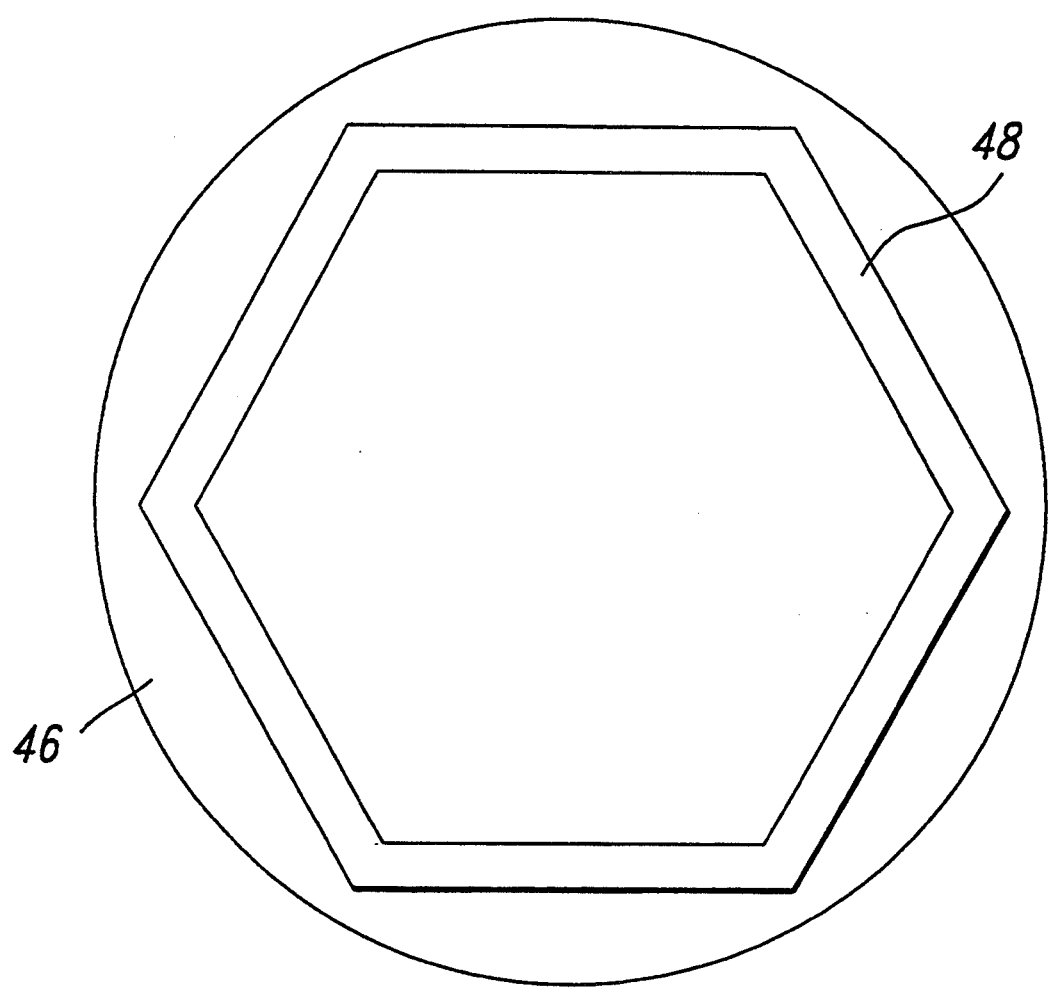
FIG. 7 is a top view of a plasma reactor susceptor plate that has been modified to accept a saw frame.

After the protective coating has been removed from the wafer, portions of the spacer layer 68 or 92 must be removed to leave the mirror or accelerometer support beam. This undercut operation is typically done in a plasma reactor. To prevent exposing the adhesive 21 on the dicing tape 22 to the plasma, a protective cover may be placed over the exposed adhesive 21 of the dicing tape 22. FIGS. 6 and 6A show the sawn wafer 26 mounted in a saw frame 24 with a protective cover 44 over the exposed adhesive 21 or the dicing tape 22. For clarity, the individual devices are not shown in FIG. 6A. The protective cover 44 may be fabricated from any material that will withstand exposure to the plasma reactor. For example, the cover could be a ceramic ring or donut attached to the dicing tape. Another alternative would be to use another piece of dicing tape cut to the proper shape and mounted so that the adhesive side of the dicing tape used as protective cover 44 and dicing tape 22 are together. The protective cover could also be quartz or metal or any other material that can withstand the plasma etch environment. The saw frame with the sawn wafer and protective cover attached may be placed on a susceptor plate designed to hold the saw frame while the mirrors or accelerometer beams are undercut using a plasma etch process. FIG. 7 shows a susceptor plate 46 with a recessed area 48 designed to hold the saw frame 24 during the plasma etch process.

Figure 8:
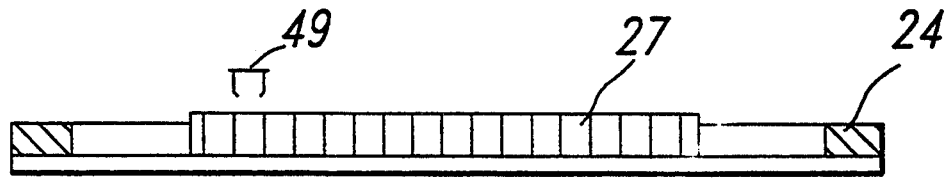
FIG. 8 is a sectional view of a wafer of completed devices undergoing electrical testing.

After the undercutting operation, the devices may be passivated and both electrically and optically tested while they are still attached to the saw frame. Because the wafer is essentially still intact, testing should be greatly simplified because the individual devices 27 should still be registered to one another. Therefore, as shown in FIG. 8, the multiprober probecard 49 should be able to accurately align, or register, with each device 27 by registering once to the sawn wafer. If there is some device movement on the dicing tape, then a vision assisted multiprober can be used to register each device individually.

After the devices have been tested, the saw frame and wafer may be mounted on a pick-and-place machine to remove the devices from the dicing tape and place them on a lead frame for the package assembly process. The device demount process of the modified process flow as taught by this invention should be the same as the standard IC device demount process. Therefore, no modifications should be necessary to the device demount and package assembly process.

Thus, although there has been described to this point a particular embodiment for a method of microelectronic mechanical device fabrication in which the devices are separated from the wafer prior to completing device fabrication, it is not intended that such specific references be considered as limitations upon the scope of this invention except in-so-far as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims.

What is claimed is:

1. A method of fabricating a microelectronic device comprising the steps of:
   providing a piece of dicing tape having an adhesive side;
   mounting a wafer on the adhesive side of said dicing tape, said wafer containing partially fabricated devices;
   subdividing said wafer to separate said partially fabricated devices, said separated devices remaining mounted to said dicing tape;
   placing a protective cover over exposed portions of the adhesive side of said dicing tape;
   continuing the fabrication of said separated devices while the protective cover remains over the exposed portions of the adhesive side of said dicing tape; and
   removing said devices from said dicing tape.

2. The method of claim 1 wherein said protective cover is selected from the group consisting of ceramic, metal, quartz and dicing tape.

3. The method of claim 1 and further comprising applying a temporary protective coating to said devices prior to said subdividing step.

4. The method of claim 3 further comprising the step of removing said temporary protective coating from said devices.

5. The method of claim 1 wherein said devices are digital micromirror devices.

6. The method of claim 1 wherein said devices are accelerometers.

7. The method of claim 1 wherein said continuing fabrication step includes plasma etching said devices.

8. The method of claim 1 wherein said continuing fabrication step comprises passivating said devices.

9. The method of claim 1 wherein said continuing fabrication step comprises testing said devices.

10. A method of fabricating a digital micromirror device comprising the steps of:
    providing a piece of dicing tape having an adhesive side;
    mounting a wafer on the adhesive side of said dicing tape, said wafer containing partially fabricated digital micromirror devices;
    subdividing said wafer to separate said partially fabricated digital micromirror devices, said separated digital micromirror devices remaining mounted to said dicing tape;
    placing a protective cover, selected from the group consisting of ceramic, metal, quartz and dicing tape, over exposed portions of the adhesive side of said dicing tape;
    continuing the fabrication of said separated digital micromirror devices while the protective cover remains over the exposed portions of the adhesive side of said dicing tape; and
    removing said digital micromirror devices from said dicing tape.

11. The method of claim 10 wherein said continuing fabrication step includes plasma etching said digital micromirror devices.

12. The method of claim 10 wherein said continuing fabrication step comprises passivating said digital micromirror devices.

13. The method of claim 10 wherein said continuing fabrication step comprises testing said digital micromirror devices.

14. The method of claim 10 and further comprising applying a temporary protective coating to said digital micromirror devices prior to said subdividing step.

15. The method of claim 14 further comprising the step of removing said temporary protective coating from said digital micromirror devices.

16. A method of fabricating an accelerometer comprising the steps of:
    providing a piece of dicing tape having an adhesive side;
    mounting a wafer on the adhesive side of said dicing tape, said wafer containing partially fabricated accelerometers;
    subdividing said wafer to separate said partially fabricated accelerometers, said separated accelerometers remaining mounted to said dicing tape;
    placing a protective cover, selected from the group consisting of ceramic, metal, quartz and dicing tape, over exposed portions of the adhesive side of said dicing tape;
    continuing the fabrication of said separated accelerometers while the protective cover remains over the exposed portions of the adhesive side of said dicing tape; and
    removing said accelerometers from said dicing tape.

17. The method of claim 16 wherein said continuing fabrication step includes plasma etching said accelerometers.

18. The method of claim 16 wherein said continuing fabrication step comprises passivating said accelerometers.

19. The method of claim 16 wherein said continuing fabrication step comprises testing said accelerometers.

* * * * *

UNITED STATES PATENT AND TRADEMARK OFFICE
CERTIFICATE OF CORRECTION

PATENT NO. : 5,389,182
DATED : February 14, 1995
INVENTOR(S) : Michael A. Mignardi It is certified that error appears in the above-identified patent and that said Letters Patent is hereby corrected as shown below:

Col. 3, line 10: change "better" to --before--.

Col. 3, line 37: change "better" to --before--.

Col. 3, line 41: change "frown" to --from--.

Signed and Sealed this

Twenty-sixth Day of December, 2000

Attest:

Attesting Officer

Q. TODD DICKINSON

Director of Patents and Trademarks